United States Patent
Ushiroku et al.

[11] Patent Number: 5,694,096
[45] Date of Patent: Dec. 2, 1997

[54] SURFACE ACOUSTIC WAVE FILTER

[75] Inventors: Tadamasa Ushiroku; Hideharu Ieki, both of Nagaokakyo, Japan

[73] Assignee: Murata Manufacturing Co., Ltd., Japan

[21] Appl. No.: 656,699

[22] Filed: Jun. 3, 1996

Related U.S. Application Data

[63] Continuation of Ser. No. 271,195, Jul. 7, 1994, abandoned.

[30] Foreign Application Priority Data

Jul. 8, 1993 [JP] Japan ............... 5-169002

[51] Int. Cl.$^6$ ........................... H03H 9/64
[52] U.S. Cl. ............... 333/195; 310/313 D; 333/193
[58] Field of Search ............... 333/193–196; 310/313 R, 313 B

[56] References Cited

U.S. PATENT DOCUMENTS

| | | |
|---|---|---|
| 4,166,258 | 8/1979 | Tseng . |
| 4,492,940 | 1/1985 | Hikita et al. . |
| 4,542,356 | 9/1985 | Nakazawa et al. . |
| 4,734,664 | 3/1988 | Hikita et al. ............ 333/193 |
| 5,010,269 | 4/1991 | Hikita et al. . |
| 5,115,216 | 5/1992 | Hikita et al. . |
| 5,202,652 | 4/1993 | Tabuchi et al. . |
| 5,204,575 | 4/1993 | Kanda et al. ............ 333/195 |
| 5,223,762 | 6/1993 | Masaie et al. . |
| 5,521,453 | 5/1996 | Yatsuda .................. 333/193 |

FOREIGN PATENT DOCUMENTS

| | | |
|---|---|---|
| 0600705 | 6/1994 | European Pat. Off. . |
| 52-10944 | 2/1977 | Japan . |
| 0154805 | 3/1989 | Japan . |
| 0222512 | 10/1991 | Japan . |
| 3222511 | 10/1991 | Japan . |
| 2116307 | 2/1983 | United Kingdom . |

OTHER PUBLICATIONS

"IEEE Transactions on Microwave Theory and Techniques", Hikita et al. *Minature Saw Antenna Duplexer for 800 MHz Portable Telephone Used In Cellular Radio Systems*. vol. 36, No. 6 Jun. 1988.
Co–pending U.S. Patent Application No. 08/272151 English Translation of Japanese Patent 52-109044.

*Primary Examiner*—Benny Lee
*Assistant Examiner*—Darius Gambino
*Attorney, Agent, or Firm*—Ostrolenk, Faber, Gerb & Soffen, LLP

[57] ABSTRACT

A surface acoustic wave (SAW) filter includes a plurality of interdigital transducers located on a piezoelectric substrate along a surface wave propagation direction, at least a single one-port SAW resonator connected in series with an output side of the SAW filter, while the resonance frequency of the SAW resonator is set at a level which is higher than the passband of the SAW filter.

22 Claims, 8 Drawing Sheets

SURFACE ACOUSTIC WAVE FILTER

This is a continuation of application Ser. No. 08/271,195, filed on Jul. 7, 1994, now abandoned.

BACKGROUND OF THE INVENTION

1. Field of the Invention

The present invention relates to a surface acoustic wave filter (hereinafter referred to as a SAW filter) comprising a plurality of interdigital transducers (hereinafter referred to as IDTs) which are arranged on a piezoelectric substrate along a surface wave propagation direction, and more particularly, it relates to a SAW filter having a structure capable of increasing the amount of attenuation in the vicinity of a pass band of the SAW filter.

2. Description of the Background Art

A SAW filter is characterized in that the filter is relatively small and has steep filter characteristics. In general, therefore, SAW filters of various structures have been proposed and put into practice.

FIG. 1 is a schematic plan view showing a three IDT type SAW filter 1 as an exemplary conventional surface acoustic wave filter. The SAW filter 1 comprises three IDTs 3 to 5 which are arranged on a rectangular piezoelectric substrate 2. Numerals 6 and 7 denote reflectors. In the SAW filter 1, first comb electrodes of the IDTs 3 and 5 are commonly connected to define an input end, while a first comb electrode of the IDT 4 serves as an output end. Second comb electrodes of the IDTs 3 and 5 are connected to ground potentials.

FIG. 2 is a schematic plan view showing another exemplary conventional SAW filter 8. The SAW filter 8 comprises two IDTs 9 and 10 which are arranged on an upper surface of a piezoelectric substrate 2 along a surface wave propagation direction. Reflectors 6 and 7 are arranged on both sides of the IDTs 9 and 10. In such a two IDT type SAW filter 8, first comb electrodes of the IDTs 9 and 10 are employed as input and output ends, respectively. Second comb electrodes of the IDTs 9 and 10 are connected to ground potentials.

FIG. 3 is a schematic plan view showing still another exemplary conventional SAW filter 11. The SAW filter 11, called an interdigited interdigital type (hereinafter reffered to as IIDT type) SAW filter, comprises seven IDTs 12 to 18 which are arranged on an upper surface of a rectangular substrate 2 along a surface wave propagation direction. First comb electrodes of the IDTs 12, 14, 16 and 18 are commonly connected to be employed as an input end, while first comb electrodes of the IDTs 13, 15 and 17 are connected in common to be employed as an output end. Second comb electrodes of the IDTs 12 to 18 are connected to ground potentials respectively.

In such an IIDT type SAW filter 11 which is formed by arranging a number of IDTs 12 to 18, it is possible to reduce insertion loss.

As hereinabove described, various structures of SAW filters have been proposed for reducing insertion loss. When reduction of insertion loss is desired in a SAW filter, however, an amount of attenuation cannot be significantly increased in the vicinity of its pass band. Particularly in a SAW filter employing the aforementioned SAW resonator, the amount of attenuation is reduced in the vicinity of its pass band.

In order to increase the amount of attenuation in the vicinity of the pass band, the number of stages of the SAW filter may be increased to attain multistage connection. When the number of stages of the SAW filter is increased, however, insertion loss is disadvantageously increased in proportion to the number of stages.

Thus, conventional devices have failed to provide a SAW filter which can increase the amount of attenuation in the vicinity of its pass band without increasing insertion loss. Particularly in a mobile communication device such as a portable telephone, the frequency space between transmission and receiving sides is so narrow that it is necessary to ensure a sufficient amount of attenuation in the vicinity of the pass band. However, it has been difficult to satisfy such a requirement in the conventional SAW filter.

SUMMARY OF THE INVENTION

An object of at least one of the preferred embodiments the present invention is to provide a SAW filter having a structure which can increase an amount of attenuation in the vicinity of its pass band, particularly in a frequency region higher than the pass band.

The SAW filter according to at least one of the preferred embodiments of the present invention comprises a piezoelectric substrate, and a plurality of interdigital transducers which are formed on the piezoelectric substrate and arranged along a surface wave propagation direction. The plurality of interdigital transducers are adapted to form a SAW filter part. At least one of the preferred embodiments of inventive SAW filter further comprises at least a single one-port SAW resonator having at least one interdigital transducer, which is preferably connected in series with at least one of input and output sides of the SAW filter part, and the antiresonance frequency of the one-port SAW resonator is set at a frequency level which is higher than the pass band of the SAW filter part.

The aforementioned SAW filter part formed by a plurality of IDTS which are arranged on a piezoelectric substrate along the surface wave propagation direction also includes an IIDT type SAW filter, in addition to the aforementioned two IDT type or three IDT type SAW filter. At least one of the preferred embodiments of present invention is characterized in that at least a single one-port SAW resonator is connected in series with such a SAW filter part as hereinabove described.

According to at least one of the preferred embodiments of the present invention, at least a single one-port SAW resonator is connected in series with at least one of input and output sides of the SAW filter part. This one-port SAW resonator is structured so that its antiresonance frequency $f_a$ is set at a level which is higher than the pass band of the SAW filter part. In the pass band characteristics of the overall SAW filter, the amount of attenuation on a frequency region higher than the pass band is increased since a resonance point of the one-port SAW resonator is located at a frequency level which is higher than the pass band.

According to at least one of the preferred embodiments of the present invention, therefore, it is possible to improve the amount of attenuation at a level which is higher than the pass band by about 10 to 20 dB. Thus, steepness of the filter characteristics is increased, whereby it is possible to provide a SAW filter which may be provided in an apparatus such as a portable telephone having a narrow frequency space between transmission and receiving sides, for example.

According to another aspect of at least one of the preferred embodiments of the present invention, the piezoelectric substrate is preferably formed by a 36° Y cut—$LiTaO_3$ substrate, and the IDT of the one-port SAW resonator is structured so that the following equation (1) is satisfied when the saw filter is provided with a single one-port SAW resonator:

$$\frac{f_0}{N \times A} \leq 0.6 \quad (1)$$

while the sum of $f_0/(N \times A)$ of respective resonators is not more than 0.6 when the SAW filter is provided with a plurality of one-port SAW resonators, assuming that $f_0$ (MHz) represents the resonance frequency of the one-port SAW resonator, N represents the number of pairs of electrode fingers, and A (μm) represents an overlap length.

According to this aspect of at least one of the preferred embodiments of the present invention, the one-port SAW resonator is structured to satisfy the above equation (1) in the SAW filter employing the piezoelectric substrate comprising a 36° Y cut—LiTaO$_3$, whereby it is possible to effectively improve the amount of attenuation in a frequency region higher than the pass band without significantly increasing insertion loss, as clearly understood from embodiments described later.

According to another aspect of at least one of the preferred embodiments of the present invention, the piezoelectric substrate comprising a 64° Y cut—LiNbO$_3$, and the IDT of the one-port SAW resonator is structured so that the following equation (2) is satisfied when the SAW filter is provided with a single one-port SAW resonator:

$$\frac{f_0}{N \times A} \leq 1.1 \quad (2)$$

while the sum of $f_0/(N \times A)$ of respective SAW resonators is not more than 1.1 when the SAW filter is provided with a plurality of one-port SAW resonators, assuming that $f_0$ (MHz) represents the resonance frequency of the one-port SAW resonator, N represents the number of pairs of electrode fingers, and A (μm) represents an overlap length.

According to this aspect of at least one of the preferred embodiments of the present invention, the one-port SAW resonator is structured to satisfy the above equation (2) in the SAW filter employing a Y cut—LiTaO$_3$ substrate, whereby it is possible to remarkably improve the amount of attenuation in a frequency region higher than the pass band without much increasing insertion loss, similarly to the structure satisfying the equation (1).

The above equations (1) and (2) have been theoretically confirmed by the inventor, as clearly understood from the embodiments described later.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention are now described with reference to the accompanying drawings, to clarify the present invention.

Figure 4:
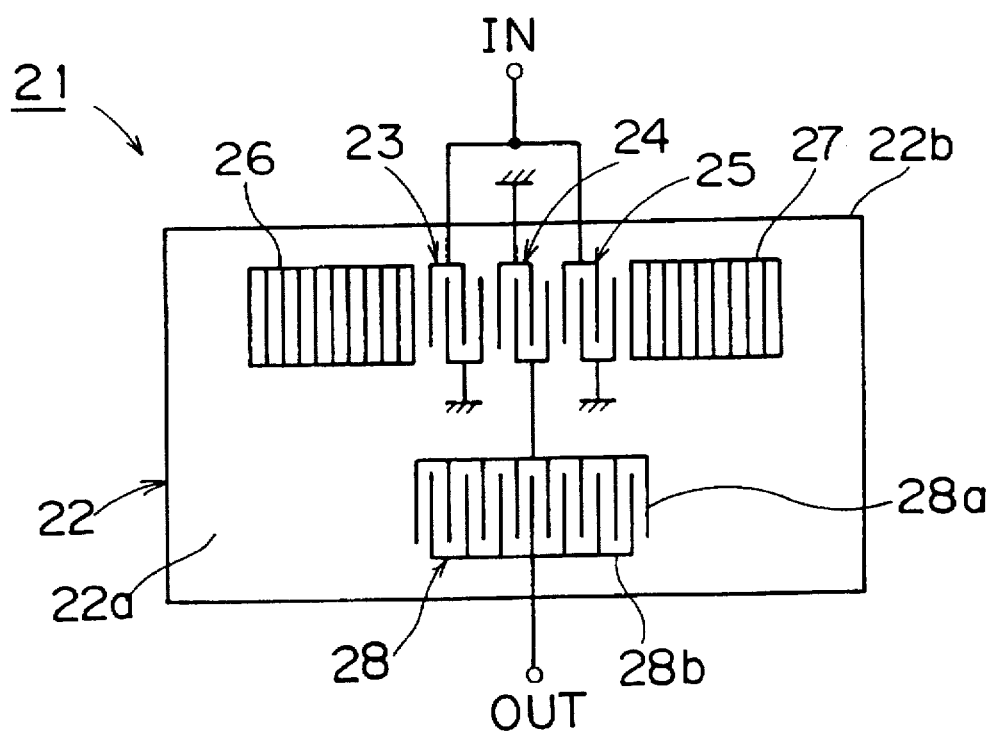
FIG. 4 is a schematic plan view for illustrating a SAW filter according to a first preferred embodiment of the present invention.

FIG. 4 is a schematic plan view showing a SAW filter 21 according to a first preferred embodiment of the present invention. The SAW filter 21 is composed by a rectangular piezoelectric substrate 22. On an upper surface 22a of the piezoelectric substrate 22, a plurality of IDTs 23 to 25 are arranged on an edge 22b side along a surface wave propagation direction.

The IDTs 23 to 25 are adapted to form a three IDT type SAW filter part. First comb electrodes of the IDTs 23 and 25 are commonly connected as shown in FIG. 4, to define an input end. Second comb electrodes of the IDTs 23 and 25 are connected to ground potentials as shown in FIG. 4.

On the other hand, a first comb electrode of the IDT 24 is connected to a ground potential, while a second comb electrode thereof is connected to an output end OUT through a one-port SAW resonator 28 as described below.

The feature of this preferred embodiment resides in that the one-port SAW resonator 28 is connected in series between the second comb electrode of the IDT 24 and the output end OUT, i.e., on an output side of the three IDT type SAW filter part.

The one-port SAW resonator 28 has a pair of comb electrodes 28a and 28b having plural electrode fingers which are interdigitated with each other. The comb electrode 28a is connected to the second comb electrode of the IDT 24, while the other comb electrode 28b is connected to the output end OUT.

The SAW resonator 28 is structured so that its antiresonance frequency $f_a$ is set at a frequency level higher than the pass band of the three IDT type SAW filter part which is formed by the IDTs 23 to 25. Therefore, it is possible to increase the amount of attenuation at a frequency region higher than the pass band in filter characteristics of the SAW filter 21, as clearly understood from the operation principle of the present invention described later.

Figure 5:
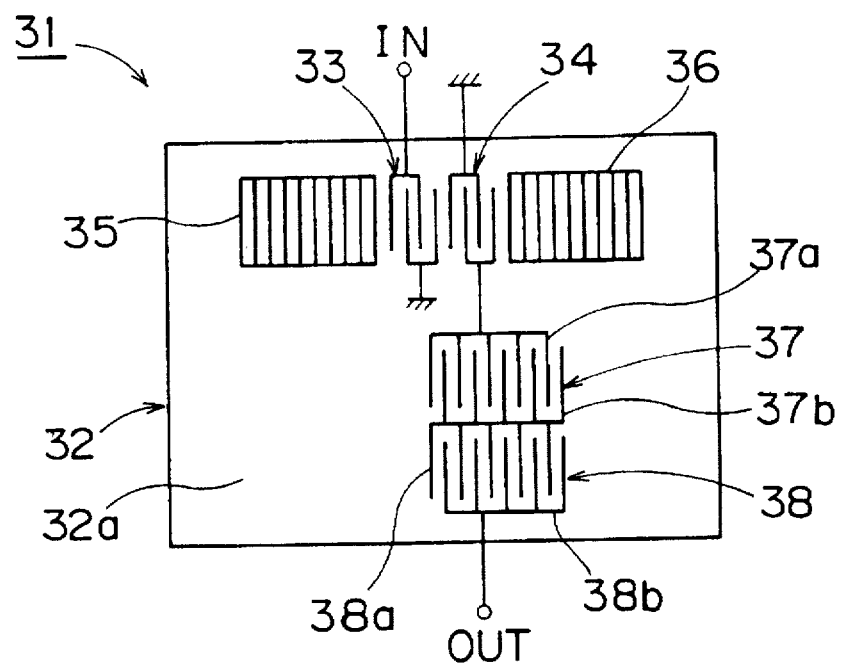
FIG. 5 is a schematic plan view showing a SAW filter according to a preferred second embodiment of the present invention.

FIG. 5 is a schematic plan view showing a SAW filter 31 according to a second preferred embodiment of the present invention.

Two IDTs 33 and 34 are arranged on a rectangular piezoelectric substrate 32. First and second comb electrodes of the IDT 33 are connected to an input end and a ground potential, respectively. A first comb electrode of the IDT 34 is connected to a ground potential, while a second comb electrode thereof is connected to an output end OUT through SAW resonators 37 and 38 as described later.

Figure 1:
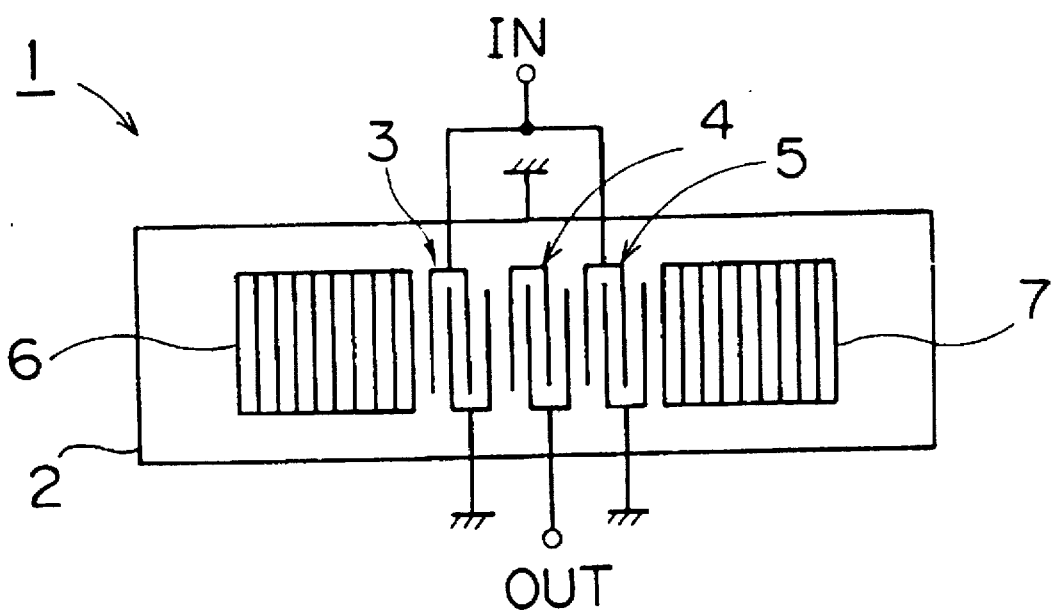
FIG. 1 is a schematic plan view showing a conventional three three IDT type SAW filter.
Figure 2:
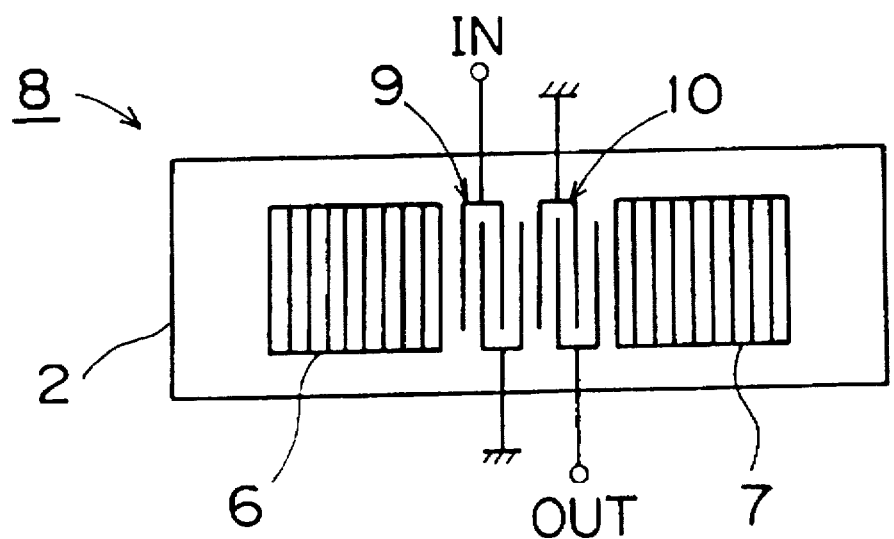
FIG. 2 is a schematic plan view showing a conventional two IDT type SAW filter.
Figure 3:
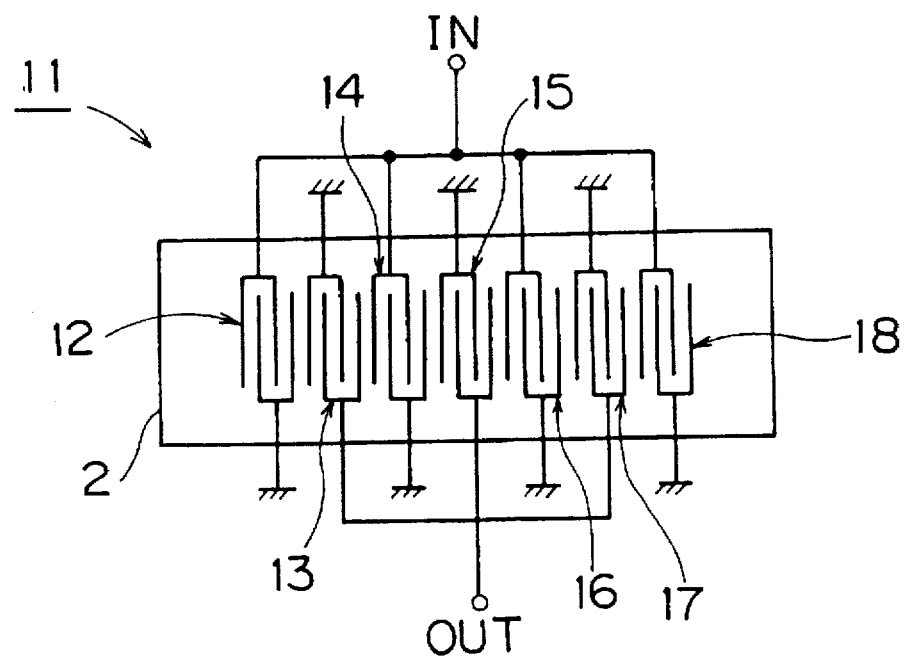
FIG. 3 is a schematic plan view showing a conventional IIDT type SAW filter.

Numerals 35 and 36 denote reflectors. Namely, the IDTs 33 and 34 and the reflectors 35 and 36 form a structure which is identical to the two IDT type SAW filter part shown in FIG. 2.

According to this preferred embodiment, the two one-port SAW resonators 37 and 38 are connected in series with the two IDT type SAW filter part on the output side thereof. Similarly to the SAW resonator 28 provided in the first preferred embodiment, the SAW resonators 37 and 38 have pairs of comb electrodes 37a, 37b, 38a and 38b, respectively. The comb electrodes 37b and 38a share a bus bar in common. The comb electrode 37a is connected to the IDT 34 while the comb electrode 38b is connected to the output end OUT, as shown in FIG. 5.

Also in the second preferred embodiment, each of the one-port SAW resonators 37 and 38 is designed so that its antiresonance frequency is set at a frequency level higher than the pass band of the two IDT type SAW filter part. Similarly to the first embodiment, therefore, it is possible to increase the amount of attenuation at a level higher than the pass band.

Figure 6:
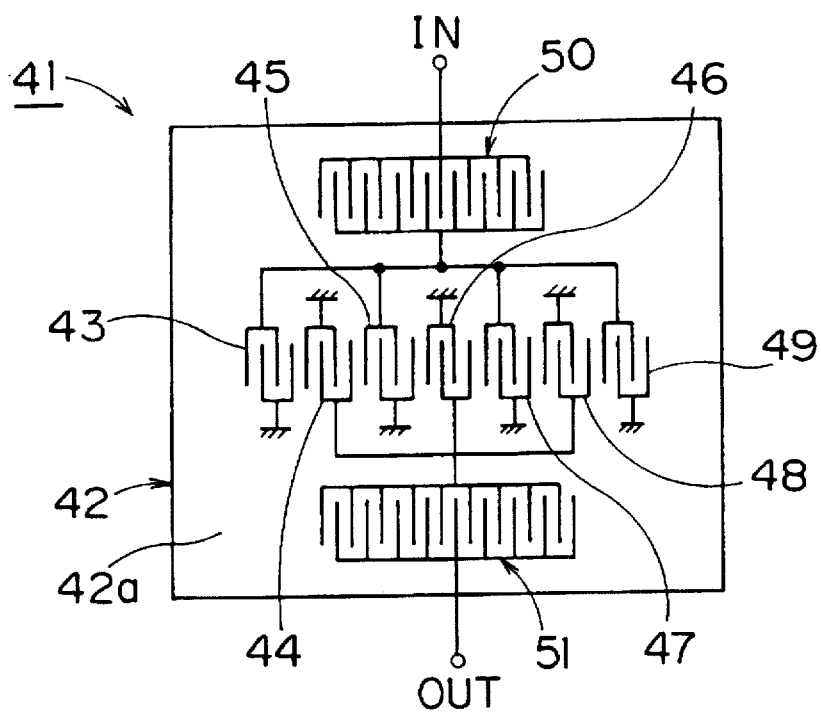
FIG. 6 is a schematic plan view showing a SAW filter according to a preferred third embodiment of the present invention.

FIG. 6 is a schematic plan view showing a SAW filter 41 according to a third preferred embodiment of the present invention. The SAW filter 41 is formed by a rectangular piezoelectric substrate 42. On an upper surface 42a of the piezoelectric substrate 42, a plurality of IDTs 43 to 49 are arranged on a central portion along a surface wave propagation direction.

The IDTs 43 to 49 are adapted to form an IIDT type SAW filter part. First comb electrodes of the IDTs 43, 45, 47 and 49 are commonly connected as shown in FIG. 6, to be connected to an input end IN through a one-port SAW resonator 50 as described later. Second comb electrodes of the IDTs 43, 45, 47 and 49 are connected to ground potentials.

On the other hand, first comb electrodes of the IDTs 44, 46 and 48 are connected to ground potentials, while second comb electrodes thereof are commonly connected to be connected to an output end OUT through a one-port SAW resonator 51 as described later.

Namely, the feature of the SAW filter 41 according to this embodiment resides in that single SAW resonators 50 and 51 are connected in series on both of input and output sides of the IIDT type SAW filter part.

Each of the one-port SAW resonators 50 and 51 is designed so that its antiresonance frequency $f_a$ is set at a frequency level higher than the pass band of the IIDT type SAW filter part which is formed on the central portion. Similarly to the first and second preferred embodiments, therefore, it is possible to increase the amount of attenuation in a frequency region higher than the pass band in the SAW filter 41 according to this preferred embodiment.

When a plurality of one-port SAW resonators are connected as in the second or third preferred embodiment, it is possible to more successfully achieve the desired characteristics of the overall SAW filter desired ones by employing SAW resonators having different resonance frequencies and impedances.

The piezoelectric substrates 22, 32 and 42 employed in the first to third preferred embodiments can be formed by well-known piezoelectric ceramic substrates or insulating substrates provided with piezoelectric thin films thereon. In the latter case, respective IDTs and reflectors may be formed on either upper or lower surfaces of the piezoelectric thin films.

The operation principle of the present invention is now described with reference to actual experimental results.

Figure 7:
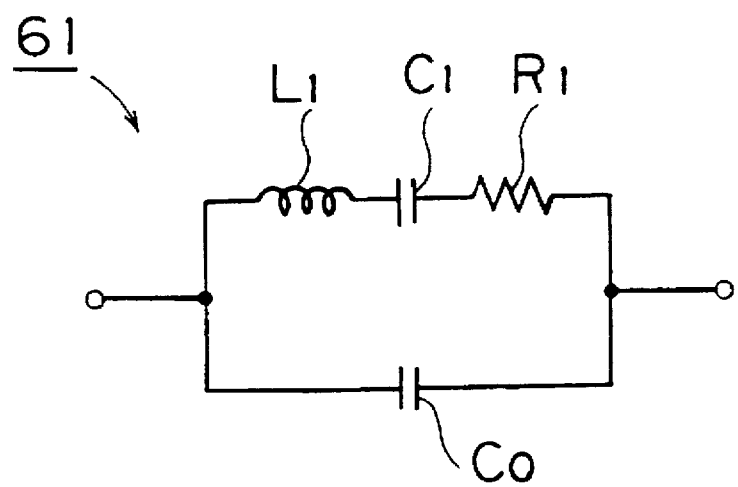
FIG. 7 illustrates an equivalent circuit of a one-port SAW resonator.
Figure 8:
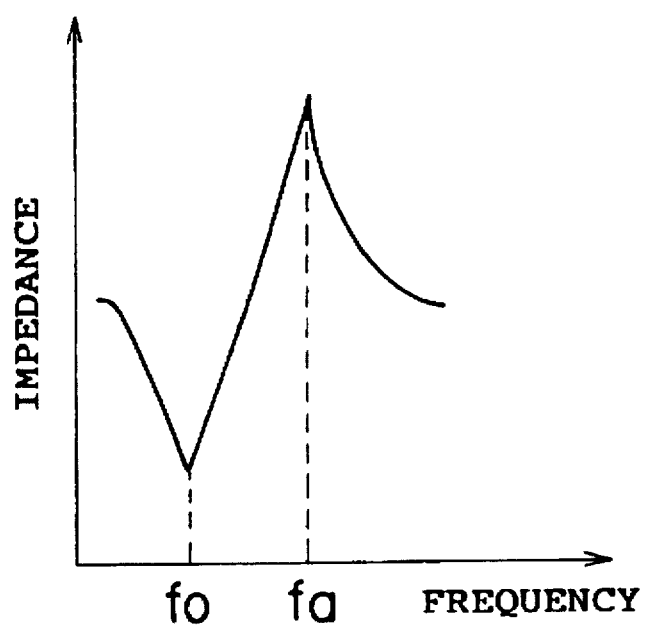
FIG. 8 illustrates impedance-frequency characteristics of the one-port SAW resonator.

In general, a one-port SAW resonator 61 is expressed in an equivalent circuit shown in FIG. 7. Referring to FIG. 7, the one-port SAW resonator 61 has an inductance $L_1$, a capacitance $C_1$ and a resistance $R_1$ which are connected in series with each other, and a capacitance $C_0$ which is connected in parallel with the inductance $L_1$, the capacitance $C_1$ and the resistance $R_1$. FIG. 8 shows impedance-frequency characteristics of this SAW resonator 61. The impedance is minimized in the vicinity of the resonance frequency $f_0$, and maximized in the vicinity of the antiresonance frequency $f_a$.

When such a one-port SAW resonator is connected in series with the aforementioned IIDT type, two IDT type or three IDT type SAW filter part at least on one of input and output sides, therefore, it is possible to form a trap having the antiresonance frequency $f_a$ of the SAW resonator as an attenuation pole. Thus, it is possible to increase the amount of attenuation in the vicinity of the antiresonance frequency $f_a$ of the SAW resonator by combining the SAW resonator with a low loss filter such as the aforementioned two IDT or three IDT type SAW filter part or an IIDT type SAW filter part.

When the antiresonance frequency $f_a$ of the SAW resonator is set at a frequency level which is higher than the pass band of the SAW filter part while the resonance frequency $f_0$ thereof is located in the pass band, it is possible to increase the amount of attenuation at a level higher than the pass band without significantly increasing insertion loss in the pass band.

If the one-port SAW resonator has a high impedance value at the resonance frequency $f_0$, however, the impedance matching range is narrowed to increase insertion loss of the SAW filter part. Thus, the IDT of the one-port SAW resonator to be added is preferably designed in response to the structure of the SAW filter part, as understood from experimental examples described later.

Assuming that $f_0$ (MHz) represents the resonance frequency of the one-port SAW resonator, N represents the number of pairs of electrode fingers and A (μm) represents the overlap length, $M=f_0/(N \times A)$ is proportionate to the inverse value of the interelectrode capacitance of the SAW resonator, and the proportional constant is decided by the substrate material.

When a plurality of one-port SAW resonators are connected with each other, $f_0/(N \times A)$ is obtained at every one-port SAW resonator, so that the sum thereof defines the aforementioned value M.

The impedance matching range is narrowed and insertion loss is increased if the aforementioned value M is increased. The upper limit of insertion loss increased by impedance mismatching is 0.5 dB in practice, and hence it is necessary to suppress increase of insertion loss below this value. Considering temperature characteristics of the piezoelectric substrate, a specific band of at least 1% is necessary.

Figure 9:
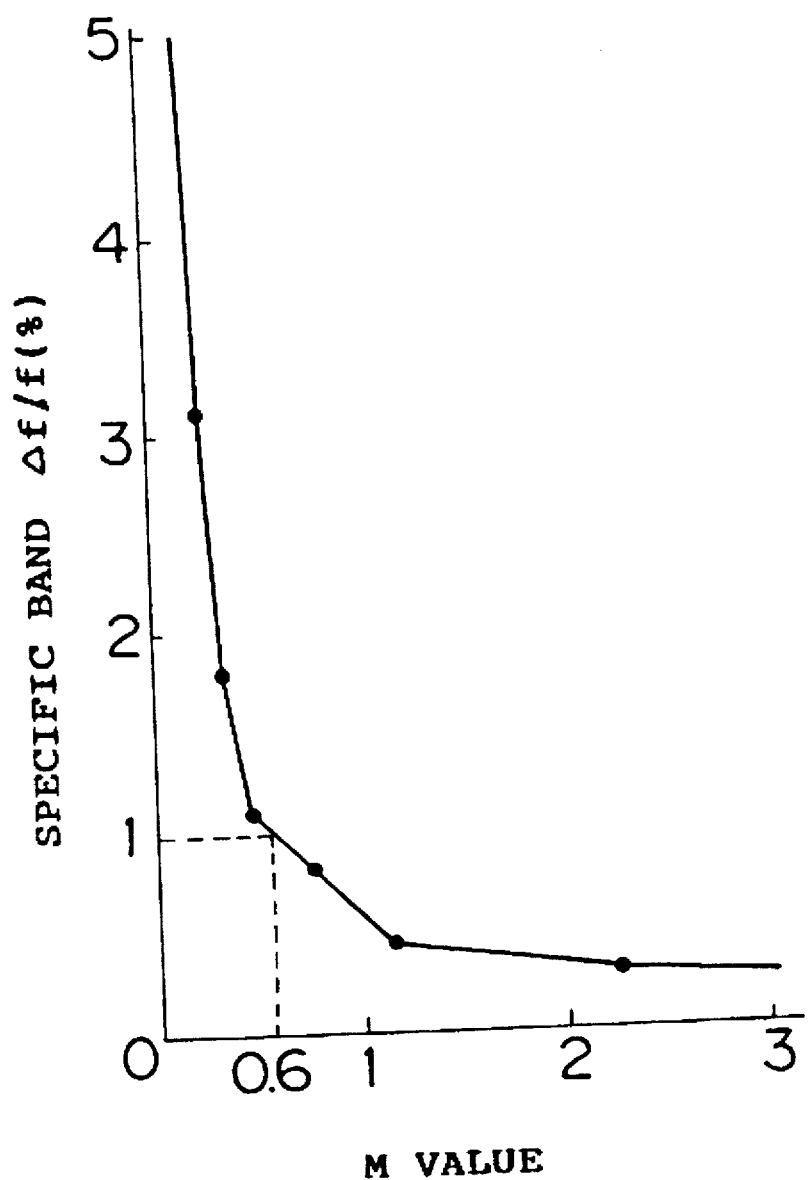
FIG. 9 illustrates changes of insertion loss measured in a 36° Y cut—LiTaO$_3$ substrate while varying M values.

FIG. 9 illustrates a specific band where deterioration of insertion loss is suppressed in a range of up to 0.5 dB upon changes of the value M with respect to a 36° Y cut—LiTaO₃ substrate. As clearly understood from FIG. 9, the value M must be not more than 0.6, in order to ensure the specific band by at least 1%.

Figure 10:
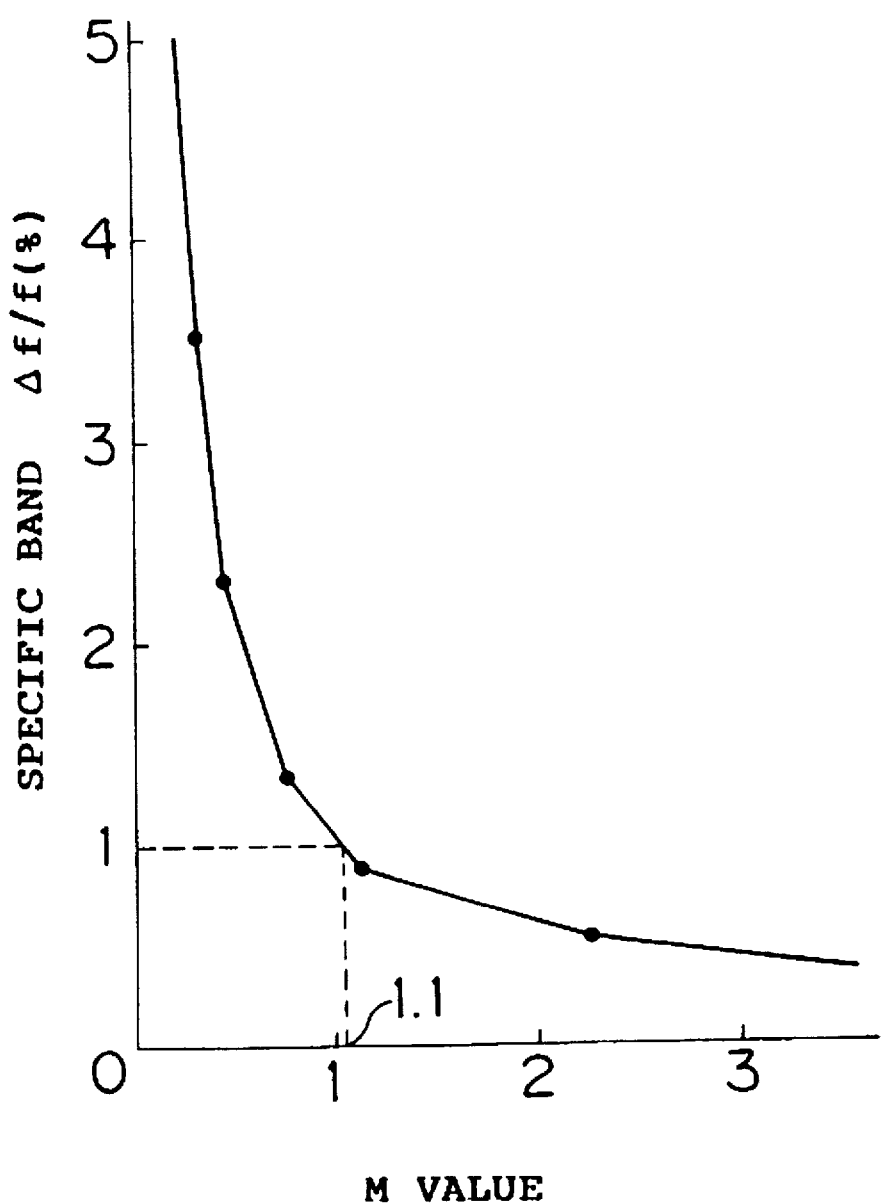
FIG. 10 illustrates changes of insertion loss measured in a 64° Y cut—LiNbO$_3$ substrate while varying M values.

FIG. 10 illustrates changes of insertion loss measured in a 64° Y cut—LiTaO₃ substrate while varying the value M. As clearly understood from FIG. 10, it is necessary to reduce the value M to not more than 1.1, in order to ensure the specific band by at least 1%.

As hereinabove described, the electrode structure of the one-port SAW resonator is preferably designed so that the value M is below a certain value in response to the material for the piezoelectric substrate, in order to avoid increase of insertion loss.

Figure 11:
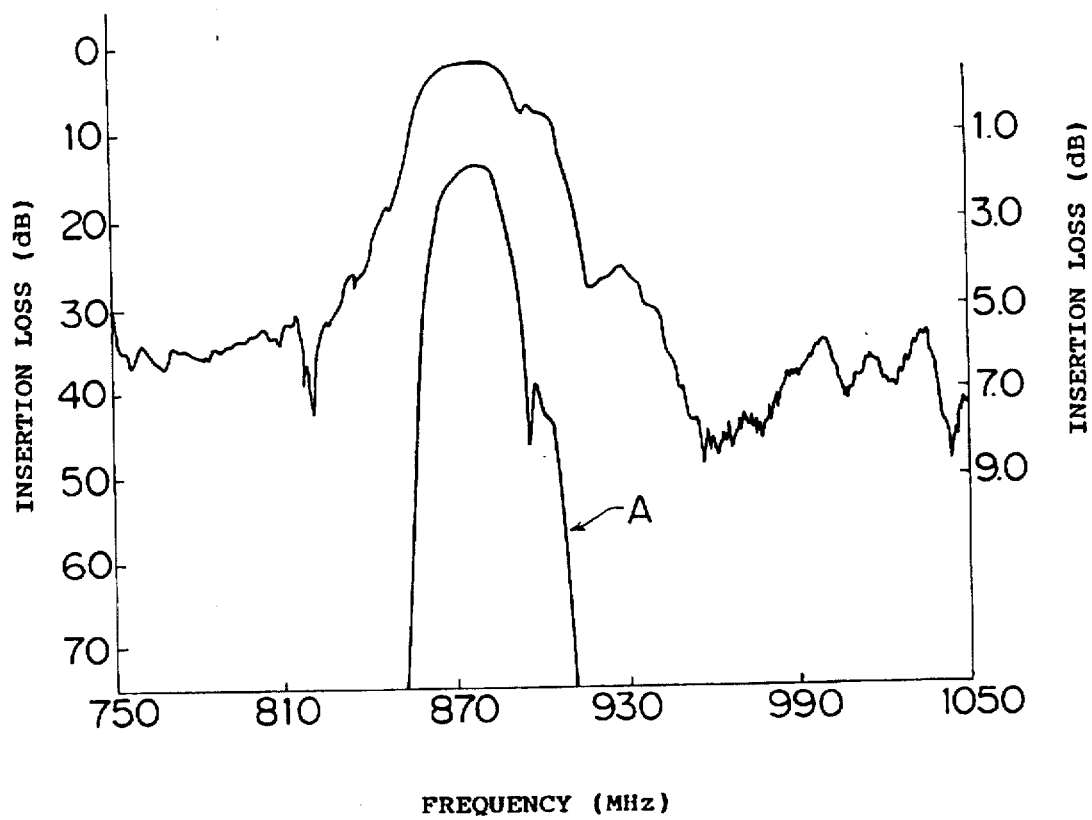
FIG. 11 illustrates insertion loss-frequency characteristics of a conventional SAW filter prepared for the purpose of comparison.

Description is now made on an experimental example of measuring insertion loss-frequency characteristics in a modification of the SAW filter 41 according to the third preferred embodiment shown in FIG. 6. While single SAW resonators 50 and 51 are respectively connected on the input and output sides of the SAW filter 41 according to the third preferred embodiment shown in FIG. 6, FIG. 11 shows insertion loss-frequency characteristics of a SAW filter connected with no such SAW resonators 50 and 51. A piezoelectric substrate for this SAW filter was prepared from a 64° Y cut LiNbO₃ piezoelectric substrate.

Figure 12:
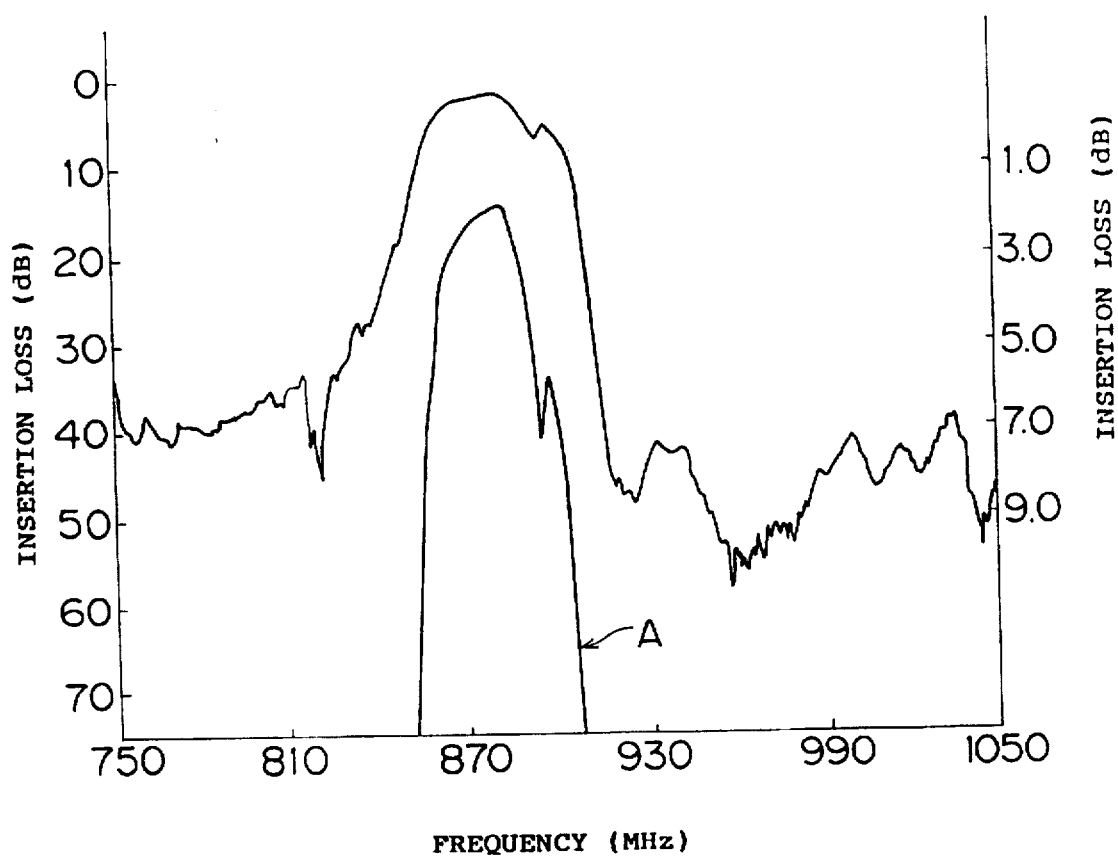
FIG. 12 illustrates insertion loss-frequency characteristics of a SAW filter according to Example connected with four one-port SAW resonators.

A sample of a SAW filter was prepared by connecting four SAW resonators similar to those shown in FIG. 6 on the output side of the SAW filter part having the characteristics shown in FIG. 11, and subjected to measurement of insertion loss-frequency characteristics. FIG. 12 shows the results.

Referring to FIGS. 11 and 12, solid characteristic curves A show principal parts of pass bands in enlarged manners, respectively, and values of insertion loss are expressed by scales shown on right sides of these figures.

Comparing FIGS. 11 and 12 with each other, it is clearly understood that the amount of attenuation on a high-pass side of the pass band is improved by about 10 to 20 dB in the structure connected with four one-port SAW resonators, while increase of insertion loss in the pass band remained at 0.3 dB.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave filter comprising:
   a piezoelectric substrate;
   a plurality of interdigital transducers formed on said piezoelectric substrate and arranged along a surface wave propagation direction, said plurality of interdigital transducers forming a surface acoustic wave filter part having input and output sides and a pass band; and
   a one-port SAW resonator which is not located along said surface wave propagation direction and which has at least one interdigital transducer, said one-port SAW resonator being connected in series with one of said input and output sides of said surface acoustic wave filter part, an antiresonance frequency of said one-port SAW resonator being set at a frequency level higher than said pass band of the surface acoustic wave filter part.

2. A surface acoustic wave filter in accordance with claim 1, wherein said one-port SAW resonator is formed on said piezoelectric substrate.

3. A surface acoustic wave filter in accordance with claim 1, wherein said piezoelectric substrate is formed by a 36° Y cut—LiTaO₃ substrate, said interdigital transducer of said one-port SAW resonator has a plurality of electrode fingers which overlap each other by a fixed overlap distance and said interdigital transducer of said one-port resonator is so structured that the following equation is satisfied:

$$\frac{f_0}{N \times A} \leq 0.6$$

wherein $f_0$ (MHz) represents the resonance frequency of said one-port SAW resonator, N represents the number of pairs of electrode fingers, and A (μm) represents said overlap distance.

4. A surface acoustic wave filter in accordance with claim 1, wherein said piezoelectric substrate consists of 64° Y cut—LiNbO₃, said interdigital transducer of said one-port SAW resonator has a plurality of electrode fingers which overlap each other by a fixed overlap distance and said interdigital transducer of said one-port resonator is so structured that the following equation is satisfied:

$$\frac{f_0}{N \times A} \leq 1.1$$

wherein $f_0$ (MHz) represents the resonance frequency of said one-port SAW resonator, N represents the number of pairs of electrode fingers, and A (μm) represents said overlap distance.

5. A surface acoustic wave filter in accordance with claim 1, wherein said one-port SAW resonator is connected to said surface acoustic wave filter part to be in series with said input or output side of said surface acoustic wave filter part.

6. A surface acoustic wave filter device in accordance with claim 1, wherein said one-port SAW resonator is a first one-port SAW resonator and wherein said surface acoustic wave filter device further comprises a second one-port saw resonator, said second one-port SAW resonator being connected in series between said first one-port SAW resonator and said one of said input and output sides of said surface acoustic wave filter part.

7. A surface acoustic wave filter in accordance with claim 1, further comprising a second one-port SAW resonator, said second one-port SAW resonator being connected in series with the other of said input and output sides of said surface acoustic wave filter part.

8. A surface acoustic wave filter in accordance with claim 1, wherein said surface acoustic wave filter part is formed by an IDT type surface acoustic wave filter.

9. A surface acoustic wave filter in accordance with claim 1, wherein said surface acoustic wave filter part is formed by a two IDT type surface acoustic wave filter.

10. A surface acoustic wave filter in accordance with claim 1, wherein said surface acoustic wave filter part is formed by a three IDT type surface acoustic wave filter.

11. A surface acoustic wave filer in accordance with claim 9, further comprising a pair of reflectors formed on said piezoelectric substrate, said pair of reflectors being located on respective sides of said plurality of interdigital transducers and along said surface wave propagation direction.

12. A surface acoustic wave filter in accordance with claim 10, further comprising a pair of reflectors formed on said piezoelectric substrate, said pair of reflectors being located on respective sides of said plurality of interdigital transducers and along said surface wave propagation direction.

13. A surface acoustic wave filter in accordance with claim 6, wherein each of said one-port SAW resonators includes a pair of comb electrodes each of said comb electrodes having a plurality of electrode fingers and a bus bar, and one of said pair of comb electrodes of said first one-port SAW resonator and one of said pair of comb electrodes of said second one-port SAW resonator sharing a common said bus bar.

14. A surface acoustic wave filter, comprising:
a piezoelectric substrate;
a surface acoustic wave filter part provided on said piezoelectric substrate and having input and output sides and a pass band, said surface acoustic wave filter part including a plurality of interdigital transducers and a pair of reflectors located on respective sides of said plurality of interdigital transducers and along a surface wave propagation direction of said plurality of interdigital transducers;
a one-port SAW resonator which is not located along said surface wave propagation direction and which has at least one interdigital transducer, said one-port SAW resonator being connected in series with one of said input and output sides of said surface acoustic wave filter part, an antiresonance frequency of said one-port SAW resonator being set at a frequency level higher than said pass band of said surface acoustic wave filter part.

15. A surface acoustic wave filter in accordance with claim 14, wherein said one-port SAW resonator is provided on said piezoelectric substrate.

16. A surface acoustic wave filter in accordance with claim 14, wherein said piezoelectric substrate is formed by a 36° Y cut—LaTaO$_3$ substrate, and said interdigital transducer of said one-port SAW resonator has a plurality of electrode fingers which overlap one another by a fixed overlap distance and said interdigital transducer of sid one-port SAW resonator is so structured that the following equation is satisfied:

$$\frac{f_0}{N \times A} \leq 0.6$$

wherein $f_0$ (MHz) represents the resonance frequency of said one-port SAW resonator, N represents the number of pairs of electrode fingers, and A (μm) represents said overlap distance.

17. A surface acoustic wave filter in accordance with claim 14, wherein said piezoelectric substrate is formed by a 64° Y cut—LaTaO$_3$ substrate, and said interdigital transducer of said one-port SAW resonator has a plurality of electrode fingers which overlap one another by a fixed overlap distance and said interdigital transducer of said one-port SAW resonator is so structured that the following equation is satisfied:

$$\frac{f_0}{N \times A} \leq 1.1$$

wherein $f_0$ (MHz) represents the resonance frequency of said one-port SAW resonator, N represents the number of pairs of electrode fingers, and A (μm) represents said overlap distance.

18. A surface acoustic wave filter in accordance with claim 14, wherein said one-port SAW resonator is a first one-port SAW resonator and wherein said surface acoustic wave filter further comprises a second one-port SAW resonator, wherein said second one-port SAW resonator is connected in series between said first one-port SAW resonator and said one of said input and output sides of said surface acoustic wave filter part.

19. A surface acoustic wave filter in accordance with claim 14, further comprising a second one-port SAW resonator connected in series with the other of said input and output sides of said surface acoustic wave filter part.

20. A surface acoustic wave filter in accordance with claim 14, wherein said surface acoustic wave filter part includes two IDTs.

21. A surface acoustic wave filter in accordance with claim 14, wherein said surface acoustic wave filter part includes three IDTs.

22. A surface acoustic wave filter in accordance with claim 18, wherein each of said one-port SAW resonators includes a pair of comb electrodes, each of said comb electrodes having a plurality of electrode fingers and a bus bar, and one of said pair of comb electrodes of said first one-port SAW resonator and one of said pair of comb electrodes of said second one-port SAW resonator share a common said bus bar.

* * * * *